(12) United States Patent
Khamisy et al.

(10) Patent No.: US 12,349,307 B2
(45) Date of Patent: Jul. 1, 2025

(54) DIRECTED COOLING IN HEAT PRODUCING SYSTEMS

(71) Applicant: Cisco Technology, Inc., San Jose, CA (US)

(72) Inventors: Elias Khamisy, Fremont, CA (US); Marcus C. Chan, Hacienda Heights, CA (US); Allison T. Yuan, Simi Valley, CA (US); Hayden W. Farriester, San Jose, CA (US); Chejung Liu, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 171 days.

(21) Appl. No.: 17/823,197

(22) Filed: Aug. 30, 2022

(65) Prior Publication Data
US 2024/0074091 A1    Feb. 29, 2024

(51) Int. Cl.
*H05K 7/20* (2006.01)
*H05K 5/02* (2006.01)

(52) U.S. Cl.
CPC ..... *H05K 7/20145* (2013.01); *H05K 7/20163* (2013.01); *H05K 7/20172* (2013.01); *H05K 5/0209* (2022.08)

(58) Field of Classification Search
CPC .......... H05K 7/20145; H05K 7/20163; H05K 7/20172; H05K 7/20727; H05K 1/0203; H05K 7/20009; H01L 23/467
See application file for complete search history.

(56) References Cited

U.S. PATENT DOCUMENTS

| | | | |
|---|---|---|---|
| 5,559,673 A * | 9/1996 | Gagnon | G06F 1/20 165/122 |
| 5,669,813 A * | 9/1997 | Jairazbhoy | B60H 1/00271 361/645 |
| 6,086,476 A * | 7/2000 | Paquin | H05K 7/20727 361/695 |
| 6,141,828 A * | 11/2000 | Kuo | A45C 13/262 16/113.1 |
| 2002/0071250 A1 | 6/2002 | Shih | |
| 2005/0041392 A1 | 2/2005 | Chen | |
| 2005/0057899 A1* | 3/2005 | Lord | F28F 3/048 361/695 |
| 2007/0133178 A1* | 6/2007 | Han | H01L 23/427 257/E23.099 |
| 2014/0139995 A1* | 5/2014 | Pav | G06F 1/20 361/679.33 |
| 2018/0054923 A1* | 2/2018 | Bryan | H05K 13/04 |
| 2018/0352676 A1* | 12/2018 | Degner | H05K 7/20154 |
| 2022/0337089 A1* | 10/2022 | Powell, Jr. | H01F 27/025 |

FOREIGN PATENT DOCUMENTS

CN    110708863 A    1/2020

* cited by examiner

Primary Examiner — Adam B Dravininkas
(74) Attorney, Agent, or Firm — Patterson + Sheridan, LLP

(57) ABSTRACT

Providing cooling airflow through an electronic device is described. The electronic device incudes a heat source, an airflow enclosure, an insulation layer, and a directional structure. The airflow enclosure is on a first side of the insulation layer and the heat source is on a second side of the insulation layer. The insulation layer includes at least one directional opening that is adjacent to the heat source. The directional structure is positioned on the second side of the insulation to provide a directed cooling airflow path from the at least one directional opening to the heat source.

18 Claims, 9 Drawing Sheets

DIRECTED COOLING IN HEAT PRODUCING SYSTEMS

TECHNICAL FIELD

Embodiments presented in this disclosure generally relate to providing cooling airflow and heat mitigation in computer/electrical systems such as data center servers, switches, and storage systems. More specifically, embodiments disclosed herein describe cooling systems with cool air isolation, heated air isolation, and directed or funneled airflow direction to provide for efficient and effective cooling for computing systems.

BACKGROUND

As computer systems increase in power and complexity, the heat output of these systems also increases. While some design improvements to these higher powered systems provide for some efficient cooling and heat mitigation, these improvements often require complicated and expensive systems that are not easily scalable within large scale computing environments. Providing efficient cooling to increasingly high power computer systems, without sacrificing efficient installation and configuration, remains a challenge.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1A:
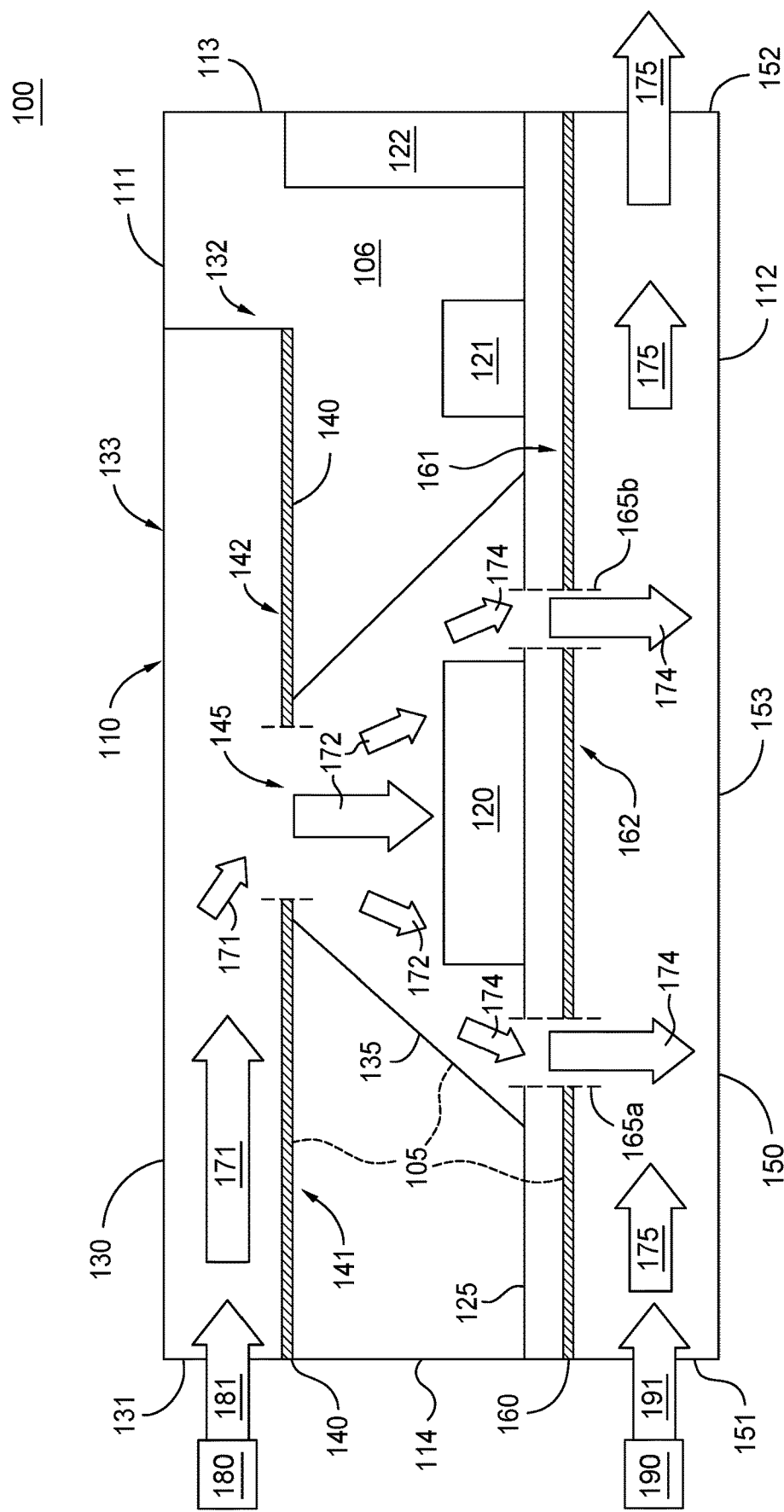
FIGS. 1A-C illustrate an electronic device with a directional cooling system, according to embodiments.

One embodiment presented in this disclosure includes an electronic device. The electronic device includes a heat source, a first airflow enclosure, and a first insulator layer. The first insulator layer may include at least one directional opening formed through the first insulator layer, where the first insulator layer is positioned between the first airflow enclosure and the heat source, where the first airflow enclosure is on first side of the first insulator layer, and where the heat source is on a second side of the first insulator layer. The at least one directional opening is adjacent to the heat source. The electronic device also includes a first directional structure positioned on the second side of the first insulator layer to provide a directed cooling airflow path from the at least one directional opening on the second side of the first insulator layer to the heat source.

One example embodiment includes a directional cooling system for an electronic device. The directional cooling system includes a first airflow enclosure and a first insulator layer. The first insulator layer may include at least one directional opening formed through the first insulator layer, and a first directional structure positioned on a side of the first insulator layer opposite the first airflow enclosure and positioned to provide a directed cooling airflow path from the at least one directional opening in the first insulator layer to a heat source.

One example embodiment includes a network server. The network server includes a heat source, a first airflow enclosure, a first insulator layer, and a first directional structure. The first insulator layer includes at least one directional opening formed through the first insulator layer, where the first insulator layer is positioned between the first airflow enclosure and the heat source, where the first airflow enclosure is on first side of the first insulator layer, and where the heat source is on a second side of the first insulator layer. The at least one directional opening is adjacent to the heat source. The first directional structure is positioned on the second side of the first insulator layer to provide a directed cooling airflow path from the at least one directional opening on the second side of the first insulator layer to the heat source.

Example Embodiments

Large scale computer systems are an increasingly utilized form of providing networked computing and storage solutions. For example, large scale data centers provide both primary and redundant computing and storage options for a variety of services including governmental, commercial, and consumer computer network based services. As these computing systems grow, a primary concern for data centers and large scale computer systems is providing efficient cooling to these systems.

Failing to keep the individual computer systems cool can cause decreased performance and damage to the computer systems. In some examples, data centers are designed to provide heat mitigation using one or several cooling systems. Some of the most effective systems use liquid cooling or immersion cooling techniques to guarantee that the heat produced by the various systems does not affect the function of the systems or damage the systems. However, the cooling systems that rely on liquid and immersion cooling, in turn require complicated and expensive installation, expensive maintenance to avoid leaks, and are not easily adaptable to expansion and scaling.

The most common and cheapest heat mitigation systems utilize cooling airflow through each of the equipment racks in a data center and the individual computer systems. The individual computer systems include cooling systems, such as fans, which move cooler ambient air through the computer system to cool the heat producing internal components of the computer system.

As the processing power of these individual computer systems increases, the cooling needs also increase to keep the systems functioning properly. In some cases, heat sensitive components within the computer system require cool airflow that can cool both the system in general, but also provide cooling airflow to specific heat sensitive components within the system. The systems described herein provide an electronic device with a directional cooling system which provides for cooling airflow to be efficiently routed through the electronic device to provide improved and directed cooling to heat producing components.

Figure 1B:
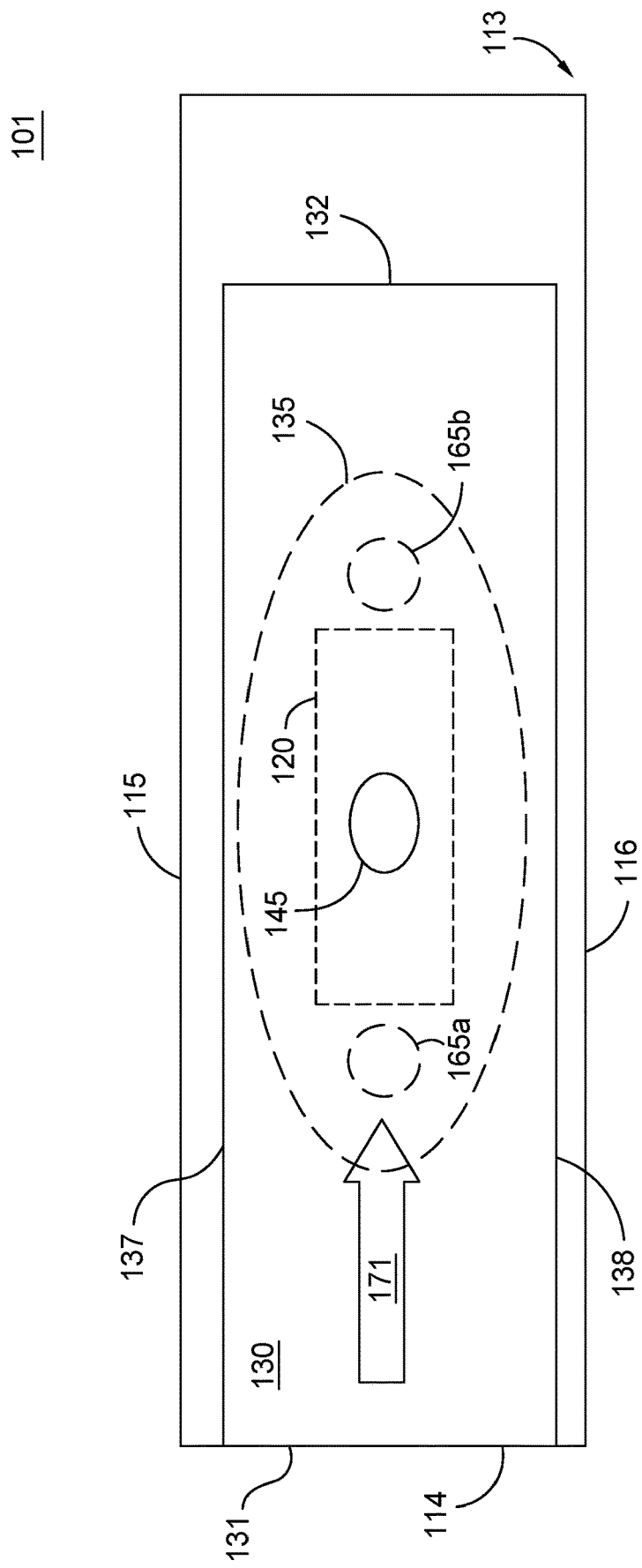
Figure 1C:
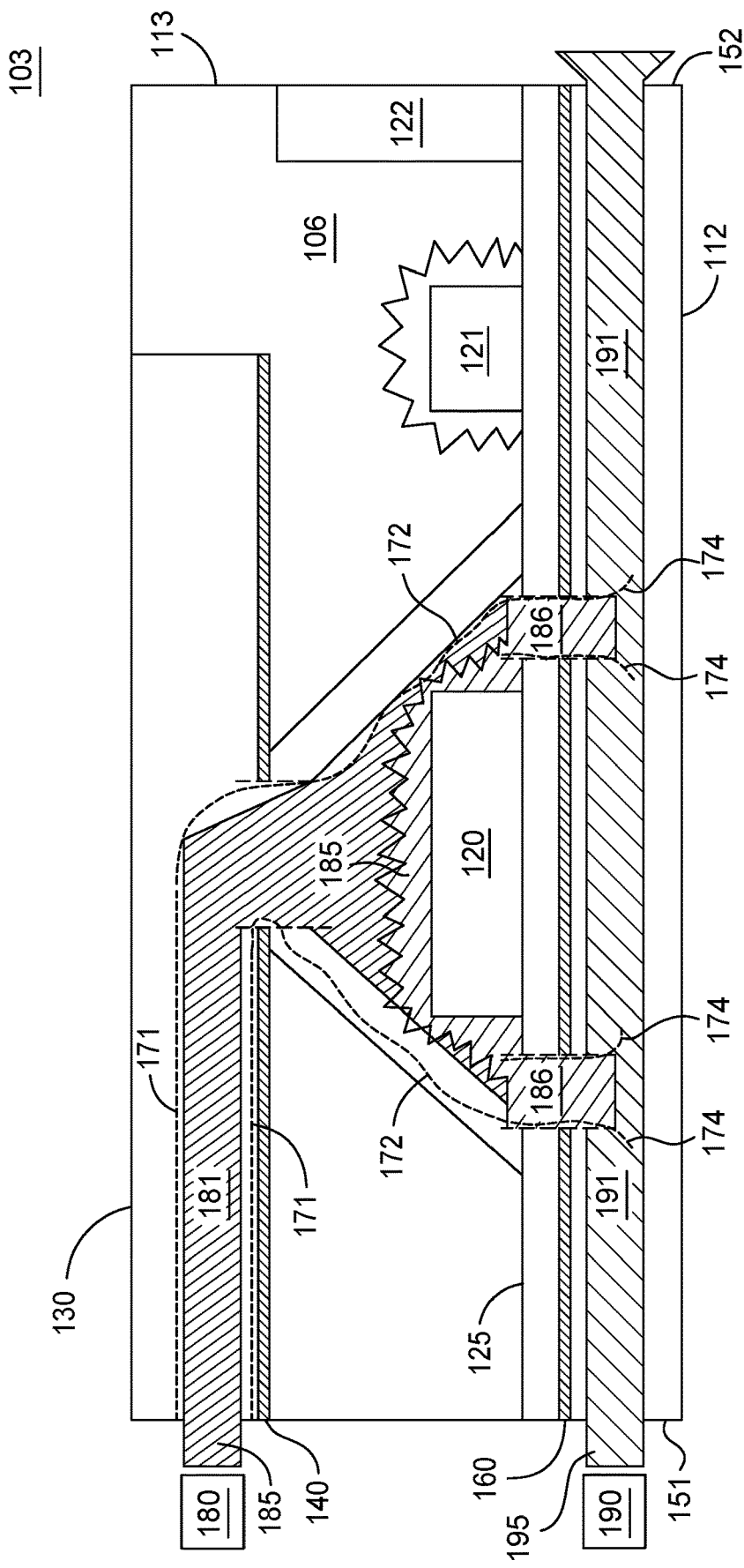

FIGS. 1A-C illustrate an electronic device with directional cooling system, according to embodiments. FIG. 1A shows a cross-section view 100 of a device 110, FIG. 1B shows a top view 101 of the device 110, and FIG. 1C illustrates a cross-section view 103 of the device 110 in operation. In order to provide efficient cooling to the device 110, the device 110 includes a directional cooling system 105 as described herein. The device 110 may include any type of computing or other electronic device. While the examples described herein primarily take the form of computing devices in a large scale deployment (e.g., network server in data center, etc.), the device 110 and directional cooling system 105 may be implemented as any type of electronic or computing device (e.g., personal computer, individual server device, memory device, etc.).

Referring first to FIG. 1A, the device 110 includes various heat producing components such as heat source 120 and heat source 121 mounted to a printed circuit board (PCB) 125. The various heat producing components, including the heat sources 120 and 121, may include any type of common heat producing or heat exchanging components in an electronic device. These heat sources may include electronic components including processors (central processing units (CPUs), etc.), application-specific integrated circuits (ASICs), chips, controllers, optical processing components, heat exchangers (including heatsinks), etc.

During operation of the device 110, which is described in more detail in FIG. 1C, the heat sources 120 and 121 produce heat which radiates from the heat sources and throughout the device 110. Many electronic devices, such as the device 110, include cooling systems which mitigate the heat production in order to keep the device 110 functioning properly. In some cases, the heat sources 120 and 121 may overheat and cause malfunctions to themselves or each other if the heat produced by the components is not mitigated. Additionally, the device 110 may include components which are more sensitive to heat and thus may operate less efficiently or malfunction if exposed to the heat produced from the heat sources 120 and 121.

For example, the device 110 includes heat sensitive components, components 122, which may include ports, optical connections, communication devices (e.g., retimers), ASICs, and other heat sensitive electronic, optical, or communication components. The heat sources 120 and 121 as well as the components 122 are positioned in the device 110 to interact and communicate in the device 110 to provide processing, communication, storage, and other functions in an enterprise level or other large scale computing environment. In some examples, the components 122 may require lower temperatures than the heat sources to operate, such that heat radiated by the heat sources may cause optical components to malfunction. As the heat produced by the various components of the device 110 (including the heat sources 120 and 121) increases, providing efficient heat mitigation and cooling increases in necessity and importance.

In some examples, electronic devices, such as the device 110, provide cooling airflows through an enclosed chassis or structures to provide heat mitigation and cooling. In some examples, the device 110 is an enclosed device, such as a server mounted in a server rack. For example, the device 110 includes sides 111-114. The side 111 is a top side, the side 112 is a bottom side, the side 113 is an exhaust side, and the side 114 is an intake side. The side 111 and the side 112 may be formed by solid metal (e.g., aluminum) sheets or other form of enclosure. The sides 113 and 114 may include vents or other appropriate openings which allow for cooling airflow to enter an interior 106 of the device 110.

In some example deployments, the device 110 is situated in a cold air/hot air configuration in a large scale computing environment such as a data center. In this example, the side 114 is positioned within the large scale computing environment to intake cold air from a cold air aisle, where the cold air brought into the device 110 provides cooling capacity to the heat producing and heat sensitive components in the device 110, including the heat sources 120 and 121 and the components 122. As described above, the device 110 produces a large amount of heat during operation, including through the function or operation of the heat sources 120 and 121. In some examples, as cooling air flows from the side 114 to the side 113, the cooling air interacts with the heat sources to cool the heat sources 120 and 121. However, as the cooling air passes through the device from the side 114 to the side 113, the cooling air may heat to a higher temperature than the temperature of the air at the side 114 such that less heat is exchanged with some components in the device 110.

For example, without the directional cooling system 105 described herein, when a cooling flow interacts with the components 122 (or the heat source 121) the cooling flow may have heated to a point where little heat is exchanged between the components 122 and the cooling flow. This lack of sufficient cooling to some components in the device 110 can cause the overall device performance to suffer, cause malfunctions of the device, and cause increased wear on the devices, including the individual components within the device 110 and the device 110 overall.

In order to provide sufficient cooling airflow to every heat producing and heat sensitive component in the device 110, the device 110 includes the directional cooling system 105. The directional cooling system 105 includes a first airflow enclosure, enclosure 130, and a second airflow enclosure, enclosure 150. The directional cooling system 105 also includes a first directional structure, structure 135, positioned between the enclosure 130 and enclosure 150 to provide a directed cooling airflow path to the heat source 120 as described in more detail herein. In the examples shown in FIGS. 1A-C, the enclosure 130 is generally positioned in a top portion of the device 110, the enclosure 150 is generally positioned in a bottom portion, and the structure 135 is positioned between the enclosures 130 and 150; however, the enclosures 130 and 150 may also be flipped within the device 110 (e.g., enclosure 150 is positioned in the top portion and enclosure 130 is positioned in the bottom portion) or arranged in any suitable manner to provide the functions of the directional cooling system 105 described herein.

In some examples, the enclosure 130 is a cooling airflow chamber which provides directed cooling airflow paths and associated cooling airflows to various heat sources in the device 110. The enclosure 130 includes a first side, side 131, a second side, side 132, and a top side, side 133. The enclosure 130 also includes an insulator layer, layer 140, where a first side, side 141, of the layer 140 faces the interior 106 of the device 110 (i.e., faces the heat sources 120 and 121, etc.). A second side, side 142, of the layer 140 faces the interior of the enclosure 130. The layer 140 provides insulation from heat between the cool air in the enclosure 130 and heated air in the interior 106 and radiating heat from the heat sources 120 and 121. In some examples, the layer 140 and other insulator layers described herein include materials, such as plastic or other materials which provide insulation between the enclosures and the heat sources.

In some examples and as shown in FIG. 1B, the enclosure 130 also includes sides 137 and 138, where the sides 137 and 138 are within the device 110. In another example, the enclosure 130 may be formed using the sides of the device 110, such as sides 115 and 116. The side 131 includes vents or other openings that allow for airflow to enter the enclosure 130. The layer 140 includes one or more directional openings, described herein, which allows for the airflow in the enclosure 130 to exit via the directional openings in the layer 140. In some examples, the sides 132, 133, 137, and 138, are sealed such that any airflow passing through the enclosure 130 travels through directional openings in the layer 140.

The directional openings in layer 140 are shown in FIGS. 1A-C. For example, as shown in FIG. 1A, the layer 140 includes a directional opening 145 formed through the layer 140. In some examples, the directional opening 145 is formed in the layer 140 in a portion of the layer 140 adjacent to the heat source 120 such that cooling airflow travels from the enclosure 130 through the directional opening 145 and near the heat source 120. This placement near or adjacent to the heat source 120 ensures that the cooling airflow from the enclosure 130 efficiently passes over the heat source 120 to provide heat exchange between the heat producing heat source and the cooling airflow. As described above, the directional cooling system 105 also includes the structure 135 positioned on the side 141 of the layer 140 to provide a directed cooling airflow path, path 172, from the directional opening 145 to the heat source 120. The heat exchange, aided by the directional opening 145 and the structure 135, mitigates an effect that the heat produced from the heat source 120 may cause to other components in the device 110.

In some examples, the structure 135 is formed as a baffle, funnel, or other airflow control structure. The structure 135 may include solid structures, such as metal, plastic, or other suitable fixed material, flexible materials such as fabric, flexible plastic sheets, etc., or a combination of flexible and fixed materials. In any of the examples above, the structure 135 may be sealed against the side 141 of the layer 140, the PCB 125, or a combination of the two. In another example, the structure 135 is positioned between the enclosure 130 and the enclosure 150 to direct airflow over the heat source 120, without a sealed interface between the enclosures.

As the cooling airflow interacts with heat radiated from the heat source 120, the airflow heats or increases in temperature and may be referred to as heated exhaust. The heated exhaust has a higher temperature than the cooling air and thus may interfere with other heat sources or heat sensitive components in the device 110. The directional cooling system 105 includes the enclosure 150 to provide a path for the heated exhaust to reduce potential interactions between the heated exhaust and other components in the device 110.

In some examples, the enclosure 150 is a heated air enclosure. The enclosure 150 includes a first side, side 151, a second side, side 152, a bottom side, side 153, and a layer 160 as a top side, where the sides 151 and 152 include vents or other openings which facilitate airflow through the enclosure 150.

In some examples, the enclosure 150 is separated from the interior 106 by the layer 160. The layer 160 is an insulated layer and provides insulation between the heated air or exhaust in the enclosure 150 and the interior 106. In some examples, the layer 160 is formed on an underside of the PCB 125. In some examples, the PCB 125 may provide an insulation function without the addition of the layer 160 (i.e. the PCB 125 is the layer 160). For ease of discussion and illustration, layer 160 will be discussed herein as an independent structure in the device 110.

In some examples, the layer 160 includes at least one exhaust opening formed through the layer (e.g., formed through the insulator layer from a top side 161 to a bottom side 162 of the layer 160). In an example where the layer 160 is formed on a side of the PCB 125, respective exhaust openings are also formed through the PCB 125. For example, exhaust openings 165a and 165b are formed adjacent to the heat source 120 and through the PCB 125 and the layer 160. In operation, heated exhaust flows from the heat source 120 through the at least one exhaust opening into the enclosure 150 as described herein.

For example and as shown in FIGS. 1A and 1C, a first cooling airflow path, path 171, is formed through the enclosure 130 from a first fan, fan 180, to the directional opening 145. As described above, the directional opening and the structure 135 provides path 172 to and about the heat source 120 to provide heat exchange between the heat source 120 (including heat radiated from the heat source 120) and cooling airflow traveling along the path 172. The heat exchanged at the heat source 120 produces heated exhaust, which travels along an exhaust path, path 174, through exhaust openings 165a and 165b and into the enclosure 150.

In some examples, the enclosure 150 includes an exhaust path, path 175, from a fan 190 to a system exhaust opening in the side 152. The path 174 provides an airflow path from the heat source 120 to the path 175, which is an exhaust path out of the device 110 via the enclosure 150.

The airflows along the various paths shown in FIG. 1A are also shown in FIG. 1C when the device 110 is in operation. For example, the fan 180 is positioned to produces and directs cooling airflow 181 which travels along the path 171 to the path 172. The cooling airflow 181 interacts with a heat 185 radiating from heat source 120 as the cooling airflow travels along the path 172 and passes on and about the heat source 120. As the cooling airflow 181 exchanges heat with the heat 185 and the heat source 120, the cool air becomes heated exhaust 186.

The fan 190 produces airflow 195 which travels through the enclosure 150 and receives the heated exhaust 186 via the paths 174. The heated exhaust 186 mixes with and becomes part of the airflow 191, where the airflow 191, including the mixed in heated exhaust 186, passes through the enclosure 150 to the side 152 and out of the device 110. In some examples, in order to ensure the various airflows, including cooling airflow 181, heated exhaust 186, and the airflow 191, are properly flowing through the device 110 and the directional cooling system 105, the fan 180 provides the cooling airflow 181 at a first air pressure. For example, the fan 180 spins at a high speed in order to move air into the enclosure 130 at a first air pressure higher than atmospheric pressure.

Additionally, the fan 190 provides the airflow 191 at a second air pressure, where the airflow 191 including the heated exhaust 186 passes through the enclosure 150 at the second air pressure. For example, the fan 190 spins at a speed which is slower than the speed of the fan 180 in order to move air into the enclosure 150 at the second air pressure. In some example, the second air pressure is lower than the first air pressure, which allows for the cooling airflow 181 and heated exhaust 186 to move through the device 110 and into the airflow 191 without causing airflow interference in the device 110.

In some examples, the fans 180 and 190 may include an array of fans arranged to provide the cooling airflow 181 and airflow 191. Additionally, the fans 180 and 190 may be incorporated as part of the device 110 or may be independent of the device 110 and situated to provide the cooling airflow 181 and airflow 191 discussed above. Also, while shown in FIGS. 1A and 1C as including the fans 180 and 190 situated for a specific airflow purpose, the device 110 may also include a fan or an array of fans which provide a general airflow through the device 110 as discussed in more detail in relation to FIGS. 2 and 3A.

Figure 2:
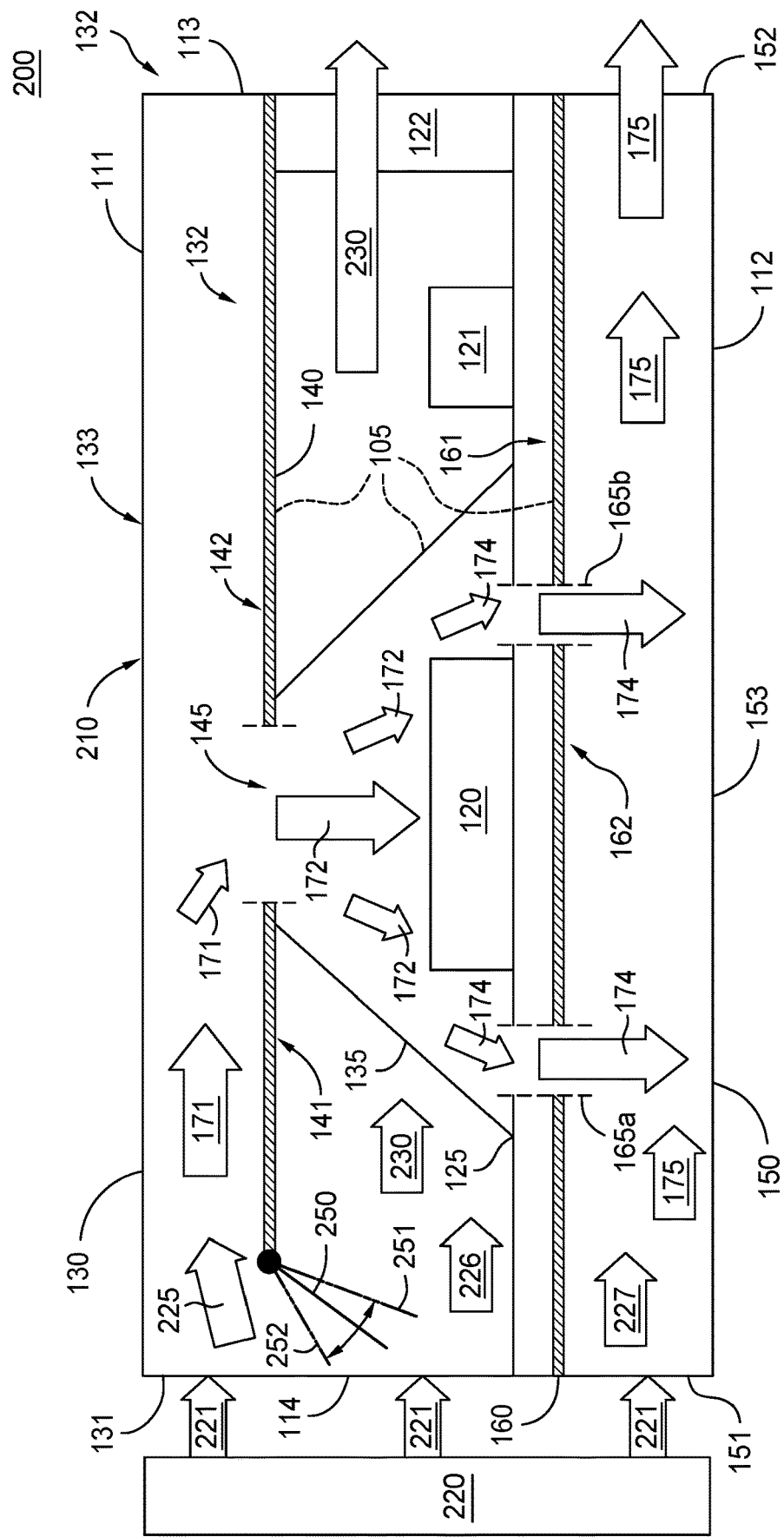
FIG. 2 illustrates an electronic device with directional cooling system, according to one embodiment.

FIG. 2 illustrates an electronic device with directional cooling system, according to one embodiment. FIG. 2 shows a cross-section view 200 of a device 210. The device 210 is similar to the device 110 shown in FIGS. 1A-C and includes the enclosure 130, the enclosure 150, and the structure 135. In the example shown in FIG. 2, the enclosure 130 of the device 210 fills an entire top portion of the device 210 such that the sides of the enclosure 130 are formed by the sides of the device 210. For example, the side 111 of the device 210 also forms the side 133 of the enclosure 130, etc.

The device 210 also includes a fan array 220 and an air direction component 250. In operation, the fan array 220 provides an airflow 221 to the device 110. A portion of the airflow 221, such as airflow 227 enters the enclosure 150 and flows along the path 175 to provide the exhaust functions of the enclosure 150. The airflow 221 may also provide a general or secondary airflow through the device, such as airflow 226 which travels along an airflow path 230 and provides a general/secondary cooling airflow to components in the device 110, including the heat source 120.

In some examples, the air direction component 250 is an airflow control louver positioned within the device 110 to direct a primary cooling airflow, such as airflow 225, from the fan array 220 into the enclosure 130, where the airflow 225 is directed to the first side of the first insulator layer, side 141 of the layer 140. In some examples, the air direction component 250 is moveable between positions 251 and 252 to adjust an amount of the airflow 221 that is directed into the enclosure 130 as the airflow 225. For example, when the air direction component 250 is in a first position, such as the position 251, the air direction component 250 directs a first portion of air flowing from the fan array as the primary cooling airflow, and when in a second position such as 252, a second portion of air flowing from the fan array as the primary cooling airflow, where the second portion is different and smaller than the first portion.

In some examples, the airflow 225 flows into the enclosure 130 at a first air pressure, where the first air pressure is adjustable based on a position of the air direction component 250. As described in relation to FIGS. 1A-C, the enclosure 130 and the layer 140 include the directional opening 145. The airflow 225 flows through the enclosure 130 along the path 171 and into the directional opening 145.

Figure 3A:
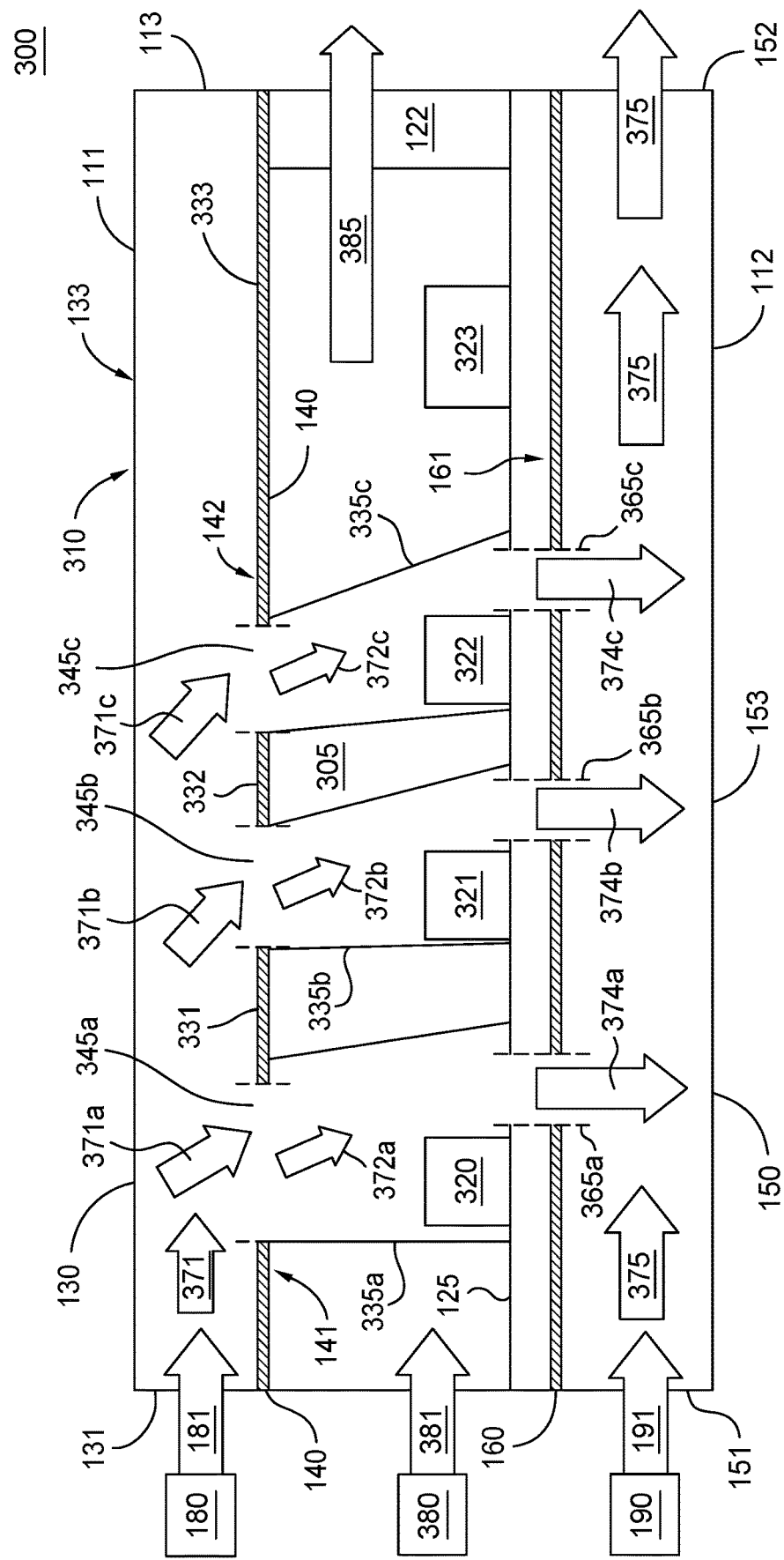
FIGS. 3A-B illustrates an electronic device with directional cooling system, according to one embodiment.
Figure 3B:
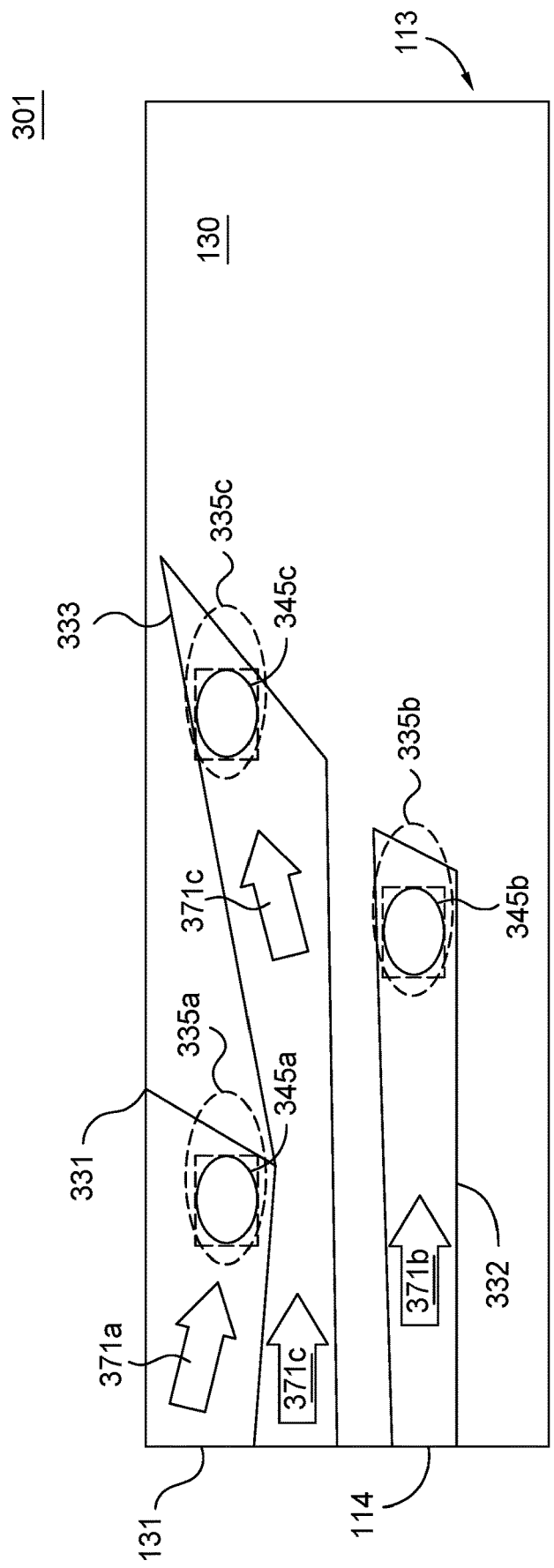

The device 110 in the FIGS. 1A-C and the device 210 in FIG. 2 illustrate cooling systems with one directional opening in the layer 140 with directed cooling provided to one heat source (i.e., heat source 120). In some examples, the directional cooling system 105 may provide directed cooling to several heat sources in the electronic devices as described in relation to FIGS. 3A-B FIGS. 3A-B illustrates an electronic device with directional cooling system, according to one embodiment. FIG. 3A shows a cross-section view 300 of a device 310 and FIG. 3B shows a top view 301 of the device 310. The device 310 is similar to the device 110, shown in FIGS. 1A-C, and the device 210, show in FIG. 2, and may formed using a combination of any of the features of the devices 110 and 210. For example, the device 310 includes the enclosure 130 and the enclosure 150. The device 310 includes additional heat sources, such as the heat sources 320, 321, 322, and 323. In some examples, a cooling system 305 provides directional cooling to each of the heat sources 320-322 using additional directional structures such as directional structures 335a-335c. The directional structures 335a-335c are similar to the structure 135 shown in FIGS. 1A-2 and are associated with respective directional openings in the layer 140. For example, directional opening 345a is associated with the directional structure 335a, directional opening 345b is associated with the directional structure 335b, and directional opening 345c is associated with the directional structure 335c.

In some examples, the enclosure 130 includes guide structures positioned within the enclosure 130 to provide directed cooling airflow paths through the first airflow enclosure to the corresponding directional openings. In some examples, the guide structures are formed from plastic or other appropriate materials and are fixed structures to provide directed airflow with pressure. For example, guide structure 331 provides path 371a to the directional opening 345a and the structure 335a provides a directed cooling airflow path, path 372a, from the directional opening 345a to the heat source 320. The cooling system 305 includes guide structures 332 and 333 which provide corresponding paths 371b and 371c through the enclosure 130. The cooling system 305 also includes structures 335b and 335c which provide paths 372b and 372c from the directional openings 345b and 345c to the heat sources 321 and 322, respectively.

As described above, the heat exchanges at the heat sources 320-322 produce heated exhaust, which travels along exhaust paths, such as paths 374a-374c, through exhaust openings 365a-365c, and into the enclosure 150. In some examples, the enclosure 150 includes an exhaust path, path 375, from a fan 190 to a system exhaust opening in the side 152. The paths 374a-c provide an airflow path from the heat sources 320-322 to the path 375, which is an exhaust path out of the device 110 via the enclosure 150.

The device 310 also includes a fan 380 which provides airflow 381. In some examples, the airflow 381 travels along path 385 through the interior of the device 310 and provides a general cooling airflow to the heat sources, including heat sources 320-322 and heat source 323. In some examples, the fan 180 produces cooling airflow 181 which travels along the paths 371a-c to the respective paths 172a-c in a similar manner as described in relation to FIG. 1C. The fan 190 produces airflow 195 which travels through the enclosure 150 and receives heated exhaust via the paths 374a-374c. The heated exhaust mixes with and becomes part of the airflow 191, where the airflow 191, passes through the enclosure 150 along the path 375 to the side 152 and out of the device 110.

In some examples, the devices 110, 210, and 310 may include multiple directional structures, such as those illustrated in FIGS. 3A-C. The directional structures, including structure 135 and structures 335a-335c may also take various differing forms and shapes described in relation to FIGS. 4A-C.

Figure 4A:
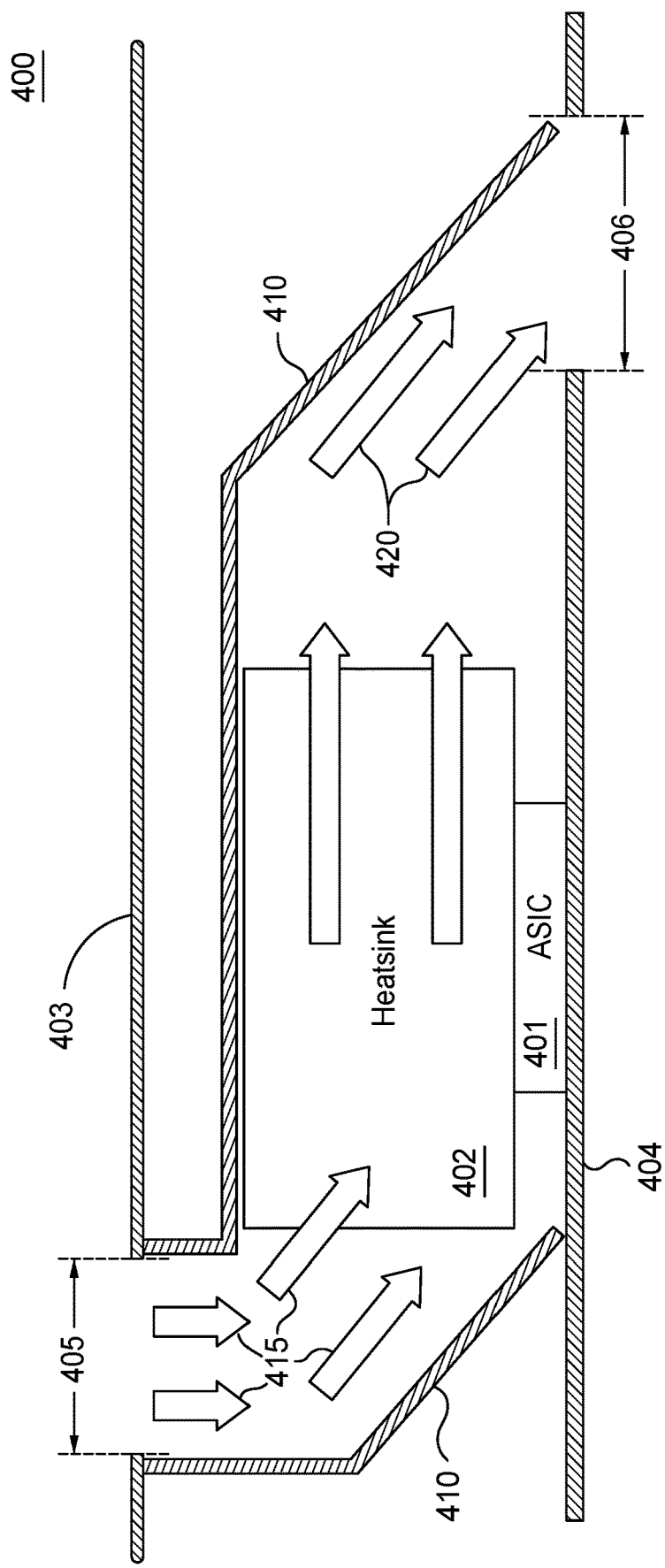
FIGS. 4A-C illustrate directional structures in directional cooling systems, according to embodiments.
Figure 4B:
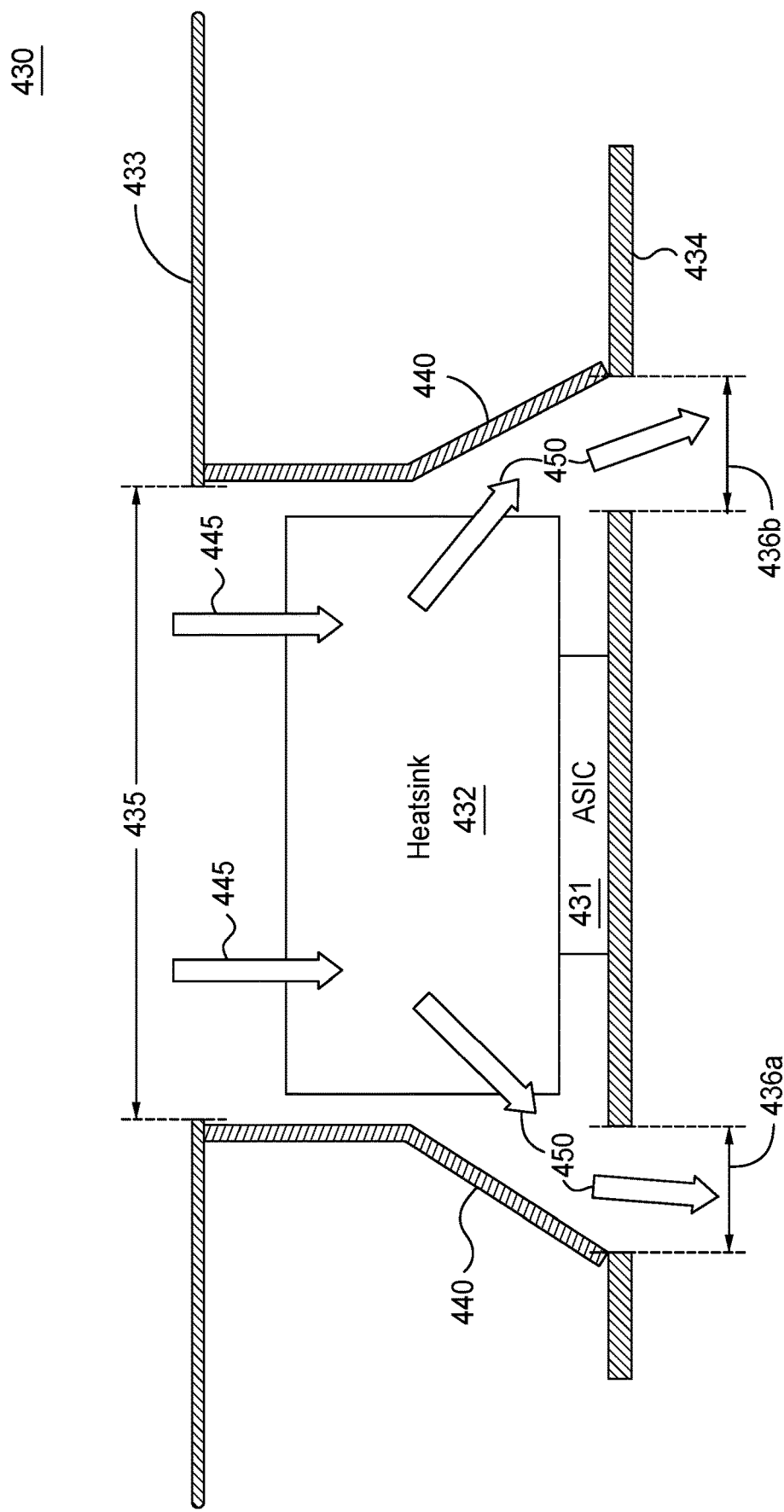
Figure 4C:
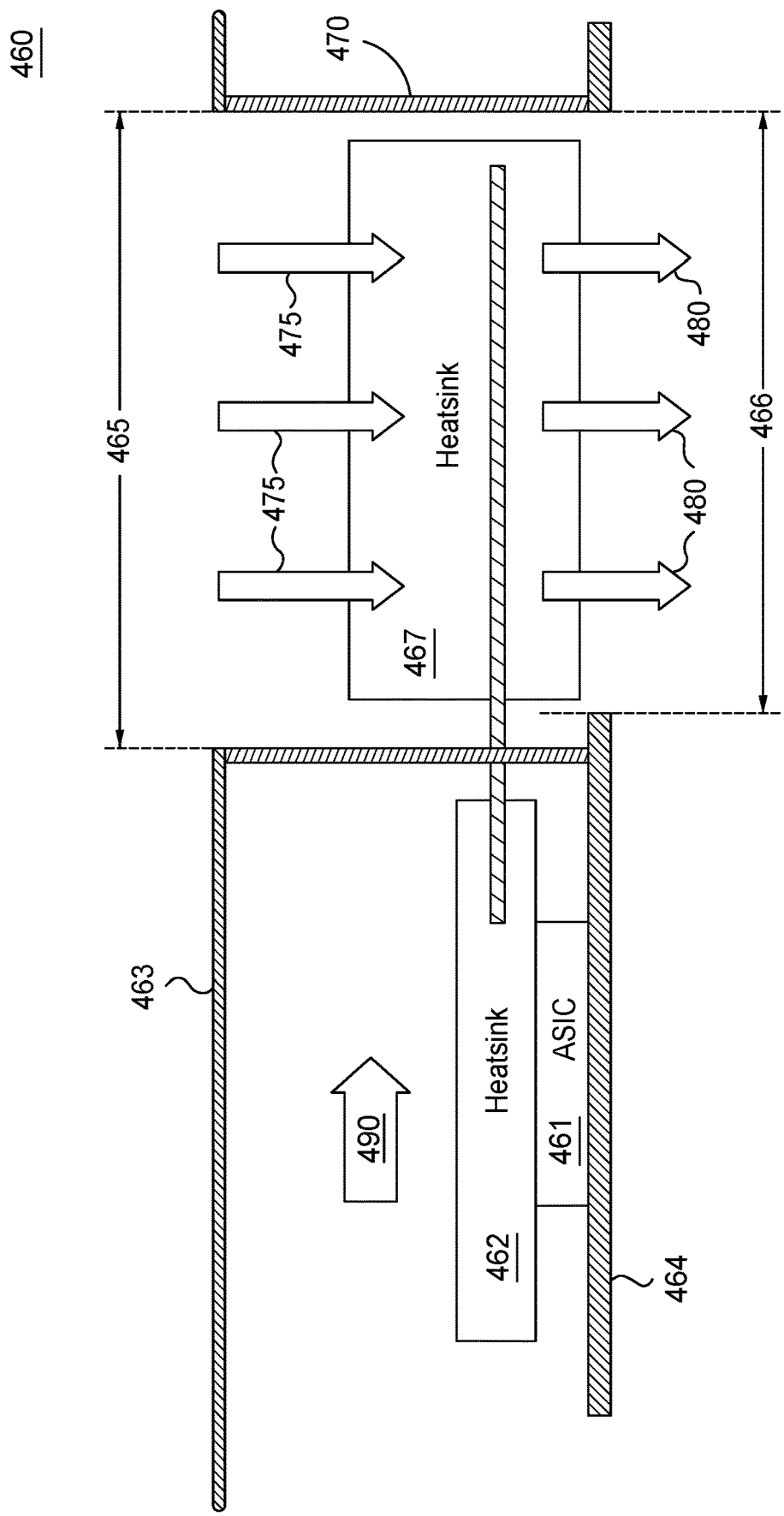

FIGS. 4A-C illustrate directional structures in directional cooling systems, according to embodiments. FIG. 4A illustrates a cross-section view 400 of a heat source including an ASIC 401 and heatsink 402. Layer 403 and layer 404 represent insulator layers such as layers 140 and 160 where airflow 415 flows from directional opening 405 and provides cooling to the heatsink 402 and ASIC 401. The heated exhaust 420 passes through exhaust opening 406. The directional cooling system shown in FIG. 4A includes a directional structure 410, which is illustrated as an angled baffle structure. The angled baffle provides for the airflow 415 and heated exhaust 420 to flow efficiently from the directional opening 405 to the exhaust opening 406. In some examples, the angled baffle character of the directional structure 410 is an optimal configuration for a standard heatsink configuration (e.g., the heatsink 402 is a standard heatsink).

FIG. 4B illustrates a cross-section view 430 of a heat source including an ASIC 431 and heatsink 432. Layer 433 and layer 434 represent insulator layers such as layers 140 and 160 described in FIGS. 1A-C, where airflow 445 flows from directional opening 435 and provides cooling to the heatsink 432 and ASIC 431. The resulting heated exhaust 450 passes through exhaust openings 436a and 436b. The directional cooling system shown in FIG. 4B includes a directional structure 440, which is illustrated as vertical airflow baffle structure. The vertical airflow baffle provides for the airflow 445 and 450 to flow efficiently from the directional opening 435 to the exhaust openings 436a and 436b. In some examples, the vertical baffle character of the directional structure 410 is an optimal configuration for a sunflower heatsink configuration (e.g., heatsink 432 is a sunflower heatsink).

FIG. 4C illustrates a cross-section view 460 of a heat source including an ASIC 461, heatsink 462, and remote heatsink 467 connected to the heatsink 462. In the example shown in cross-section view 460, a primary heat mitigation for the ASIC 461 is accomplished by the remote heatsink 467 via the connection to the heatsink 462. A secondary or general cooling airflow 490 provides general or secondary cooling to the ASIC 461 and heatsink 462.

Layers 463 and layer 464 represent insulator layers such as layer 140 and 160 described in FIGS. 1A-C, where airflow 475 flows from directional opening 465 and provides cooling to the remote heatsink 467. The airflow continues and passes through exhaust opening 466 as heated exhaust 480. The directional cooling system shown in FIG. 4C includes a directional structure 470, which is illustrated as vertical airflow baffle. The vertical airflow baffle provides for the airflow 475 and heated exhaust 480 to flow efficiently from the directional opening 465 to the openings 466. In some examples, the vertical baffle character of the directional structure 470 is an optimal configuration for a remote heatsink configuration, such as the remote heatsink 467.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. An electronic device comprising:
   a heat source mounted to a first side of a circuit board;
   a first airflow enclosure;
   a first insulator layer comprising at least one directional opening formed through the first insulator layer, where the first insulator layer is positioned between the first airflow enclosure and the heat source, where the first airflow enclosure is on first side of the first insulator layer, and where the heat source is on a second side of the first insulator layer and wherein the at least one directional opening is adjacent to the heat source;
   a first directional structure extending from the second side of the first insulator layer to the first side of the circuit board to provide a directed cooling airflow path from the at least one directional opening on the second side of the first insulator layer to the heat source;
   a second airflow enclosure;
   a first fan positioned to direct cooling air through the first airflow enclosure and the first directional structure, wherein the first fan provides the cooling air at a first air pressure through the first airflow enclosure and the first directional structure; and
   a second fan positioned to direct heated exhaust from the heat source through the second airflow enclosure to a system exhaust opening, wherein the second fan directs the heated exhaust through the second airflow enclosure at a second air pressure, wherein the second air pressure is lower than the first air pressure.

2. The electronic device of claim 1, further comprising: a first guide structure positioned within the first airflow enclosure to provide a first cooling airflow path through the first airflow enclosure to the at least one directional opening.

3. The electronic device of claim 1, further comprising:
   a second insulator layer; and
   at least one exhaust opening formed through the circuit board and the second insulator layer, wherein the second insulator layer is positioned between the circuit board and the second airflow enclosure, wherein the heated exhaust flows from the heat source through the at least one exhaust opening into the second airflow enclosure.

4. The electronic device of claim 1, wherein the first directional structure is further positioned to provide an exhaust path from the heat source to at least one exhaust opening in the electronic device.

5. The electronic device of claim 1, further comprising at least one additional heat source, wherein cool air in the first airflow enclosure is insulated from heat radiated from the heat source and the at least one additional heat source by the first insulator layer.

6. The electronic device of claim 5, wherein the at least one additional heat source comprises a second heat source, wherein the first insulator layer comprises at least one additional directional opening formed through the first insulator layer, wherein the first insulator layer is further positioned between the first airflow enclosure and the second heat source, wherein the at least one additional directional opening is adjacent to the second heat source; and
   wherein the electronic device further comprises an additional directional structure positioned on the second side of the first insulator layer to provide a directed cooling airflow path from the at least one additional directional opening on the second side of the first insulator layer to the second heat source.

7. The electronic device of claim 1, wherein the first directional structure is sealed to at least one of the second side of the first insulation layer and the first side of the circuit board.

8. The electronic device of claim 7, wherein the first directional structure is sealed to the second side of the first insulation layer and the first side of the circuit board.

9. The electronic device of claim 1, wherein the heat source comprises a processor.

10. A directional cooling system for an electronic device comprising:
  a first airflow enclosure;
  a first insulator layer comprising at least one directional opening formed through the first insulator layer;
  a first directional structure positioned on a side of the first insulator layer that is opposite the first airflow enclosure and positioned to provide a directed cooling airflow path from the at least one directional opening in the first insulator layer to a heat source;
  a second airflow enclosure;
  a second insulator layer;
  at least one exhaust opening formed through the second insulator layer, wherein the second insulator layer is positioned between the heat source and the second airflow enclosure, wherein heated exhaust flows from the heat source through the at least one exhaust opening into the second airflow enclosure;
  a first fan positioned to direct cooling air through the first airflow enclosure and the first directional structure, wherein first fan provides the cooling air at a first air pressure through the first airflow enclosure and the first directional structure; and
  a second fan positioned to direct the heated exhaust through the second airflow enclosure to a system exhaust opening, wherein the second fan directs the heated exhaust through the second airflow enclosure at a second air pressure, wherein the second air pressure is lower than the first air pressure.

11. The directional cooling system of claim 10, further comprising: a first guide structure positioned within the first airflow enclosure to provide a first cooling airflow path through the first airflow enclosure to the at least one directional opening.

12. A network server comprising:
  a heat source mounted to a first side of a circuit board;
  a first airflow enclosure;
  a first insulator layer comprising at least one directional opening formed through the first insulator layer, where the first insulator layer is positioned between the first airflow enclosure and the heat source, where the first airflow enclosure is on first side of the first insulator layer, and where the heat source is on a second side of the first insulator layer and wherein the at least one directional opening is adjacent to the heat source;
  a first directional structure extending from the second side of the first insulator layer to the first side of the circuit board to provide a directed cooling airflow path from the at least one directional opening on the second side of the first insulator layer to the heat source;
  a second airflow enclosure;
  a first fan positioned to direct cooling air through the first airflow enclosure and the first directional structure, wherein the first fan provides the cooling air at a first air pressure through the first airflow enclosure and the first directional structure; and
  a second fan positioned to direct heated exhaust from the heat source through the second airflow enclosure to a system exhaust opening, wherein the second fan directs the heated exhaust through the second airflow enclosure at a second air pressure, wherein the second air pressure is lower than the first air pressure.

13. The network server of claim 12, wherein the first directional structure is sealed to at least one of the second side of the first insulation layer and the first side of the circuit board.

14. The network server of claim 12, further comprising: a first guide structure positioned within the first airflow enclosure to provide a first cooling airflow path through the first airflow enclosure to the at least one directional opening.

15. The network server of claim 12, further comprising:
  a second insulator layer; and
  at least one exhaust opening formed through the circuit board and the second insulator layer, wherein the second insulator layer is positioned between the circuit board and the second airflow enclosure, wherein the heated exhaust flows from the heat source through the at least one exhaust opening into the second airflow enclosure.

16. The network server of claim 12, wherein the first directional structure is further positioned to provide an exhaust path from the heat source to at least one exhaust opening in the network server.

17. The network server of claim 12, further comprising at least one additional heat source, wherein cool air in the first airflow enclosure is insulated from heat radiated from the heat source and the at least one additional heat source by the first insulator layer.

18. The network server of claim 17, wherein the at least one additional heat source comprises a second heat source, wherein the first insulator layer comprises at least one additional directional opening formed through the first insulator layer, wherein the first insulator layer is further positioned between the first airflow enclosure and the second heat source, wherein the at least one additional directional opening is adjacent to the second heat source; and
  wherein the network server further comprises an additional directional structure positioned on the second side of the first insulator layer to provide a directed cooling airflow path from the at least one additional directional opening on the second side of the first insulator layer to the second heat source.

* * * * *